United States Patent
Kim et al.

(10) Patent No.: US 11,777,041 B2
(45) Date of Patent: Oct. 3, 2023

(54) FABRICATION METHOD OF PATTERNED FLEXIBLE ELECTRODE

(71) Applicants: SK Innovation Co., Ltd., Seoul (KR); Industry-Academic Cooperation Foundation, Yonsei University, Seoul (KR)

(72) Inventors: Jun Hyung Kim, Daejeon (KR); Sang Yoon Ji, Daejeon (KR); Jang-Ung Park, Seoul (KR)

(73) Assignees: SK Innovation Co., Ltd., Seoul (KR); Industry-Academic Cooperation Foundation, Yonsei University, Seoul (KR)

( * ) Notice: Subject to any disclaimer, the term of this patent is extended or adjusted under 35 U.S.C. 154(b) by 114 days.

(21) Appl. No.: 17/147,969

(22) Filed: Jan. 13, 2021

(65) Prior Publication Data
US 2021/0218011 A1 Jul. 15, 2021

(30) Foreign Application Priority Data
Jan. 14, 2020 (KR) .......................... 10-2020-0004871

(51) Int. Cl.
| | |
|---|---|
| H01M 4/18 | (2006.01) |
| H01L 31/0224 | (2006.01) |
| H01M 4/04 | (2006.01) |
| H01M 4/36 | (2006.01) |
| H01L 31/18 | (2006.01) |

(52) U.S. Cl.
CPC .. *H01L 31/022466* (2013.01); *H01L 31/1884* (2013.01); *H01M 4/0471* (2013.01); *H01M 4/366* (2013.01)

(58) Field of Classification Search
CPC .................................................. H01L 31/1884
See application file for complete search history.

(56) References Cited

U.S. PATENT DOCUMENTS

| | | | | |
|---|---|---|---|---|
| 2011/0094651 | A1* | 4/2011 | Kuriki | H01L 31/022466 |
| | | | | 977/932 |
| 2012/0070621 | A1* | 3/2012 | Nukui | H01B 1/22 |
| | | | | 427/508 |
| 2014/0319706 | A1* | 10/2014 | Huizing | B01D 69/10 |
| | | | | 264/131 |

(Continued)

FOREIGN PATENT DOCUMENTS

KR 101863818 B1 6/2018

*Primary Examiner* — Austin Murata
(74) *Attorney, Agent, or Firm* — The Webb Law Firm (57) ABSTRACT

Provided is a method of producing a patterned flexible electrode including: a nanowire formation step of applying a first dispersion containing a metal nanowire to a first sheet which is unwound from a wound state to form a nanowire network; a fiber formation step of electrospinning a second dispersion containing metal nanoparticles on the nanowire network to form a fiber-nanowire network in which a metallic fiber of the metal nanoparticles being agglomerated is incorporated into the nanowire network; a sintering step of photonically sintering the fiber-nanowire network to form a conductive network; and a patterning step of patterning the fiber-nanowire network before the sintering step or patterning the conductive network after the sintering step.

12 Claims, 3 Drawing Sheets

(56) References Cited

U.S. PATENT DOCUMENTS

| | | | |
|---|---|---|---|
| 2015/0056435 A1* | 2/2015 | Hsu | H01B 1/127 428/297.4 |
| 2015/0086805 A1* | 3/2015 | Qi | D01D 5/0038 428/605 |
| 2020/0376879 A1* | 12/2020 | Edlitz | B22F 7/04 |
| 2021/0174986 A1* | 6/2021 | Kim | H01B 5/14 |

* cited by examiner

Scale bar: 20 μm

FIG. 4

Scale bar: 1 μm

FABRICATION METHOD OF PATTERNED FLEXIBLE ELECTRODE

CROSS-REFERENCE TO RELATED APPLICATION

This application claims priority to Korean Patent Application No. 10-2020-0004871 filed Jan. 14, 2020, the disclosure of which is hereby incorporated by reference in its entirety.

BACKGROUND OF THE INVENTION

Field of the Invention

The following disclosure relates to a method of producing a patterned flexible electrode, and particularly, to a patterned flexible electrode having excellent electrical and optical properties even in a fine electrode width.

DESCRIPTION OF THE INVENTION

It is difficult for a traditional transparent electrode based on a transparent conductive oxide such as ITO to have a large area, and the traditional transparent electrode should undergo an expensive complicated process such as vacuum deposition, has greatly decreased electrical properties upon miniaturization, and has no flexibility so that it is difficult to use the electrode in a flexible fine device.

In order to improve the problems of the conventional transparent electrode, studies to use nanomaterials such as carbon nanotubes, graphene, and metal nanowires to develop a flexible transparent electrode, have been continuously conducted.

However, even when the nanomaterials are used, as a line width of the electrode is finer, a resistance of the electrode is increased by a contact resistance between nanomaterials, and also, when a large amount of current flows, the nanomaterials are damaged by electromigration or the like.

In order to overcome the problems of the nanomaterial, a technology of a hybrid structure which is formed by combining a first nanostructure having a first diameter and a second nanostructure having a second diameter which is smaller than the first diameter with each other (Korean Patent Registration No. 1863818) has been suggested. The suggested composite electrode technology shows significantly excellent electrical properties even when an electrode has a fine line width, but when the electrical properties are improved, transparency is lowered, and the electrical properties are rapidly deteriorated by repetitive bending, thereby making it difficult to use the electrode in an actual flexible or rollable device.

RELATED ART DOCUMENTS

Patent Documents (Patent Document 0001) Korean Patent Registration No. 1863818

SUMMARY OF THE INVENTION

An embodiment of the present invention is directed to providing a patterned flexible transparent electrode having excellent electrical, optical, and mechanical properties by a commercializable, simple, and rapid continuous process, and a method of producing the same.

In one general aspect, a method of producing a patterned flexible electrode includes: a nanowire formation step of applying a first dispersion containing a metal nanowire to a first sheet which is unwound from a wound state to form a nanowire network; a fiber formation step of electrospinning a second dispersion containing metal nanoparticles on the nanowire network to form a fiber-nanowire network in which a metallic fiber of the metal nanoparticles being agglomerated is incorporated into the nanowire network; a sintering step of photonically sintering the fiber-nanowire network to form a conductive network; and a patterning step of using a patterning roll to pattern the fiber-nanowire network before the sintering step or pattern the conductive network after the sintering step.

In the production method according to an exemplary embodiment of the present invention, in the patterning step, the patterning roll on which protrusions are formed may be brought into contact with each of the first sheet and a second sheet which is unwound from a wound state while rotating, the fiber-nanowire network or the conductive network may be patterned in a shape of the protrusions by the contact of the first sheet with the patterning roll and transferred to the patterning roll, and a patterned network positioned on the patterning roll may be transferred to the second sheet by the contact of the patterning roll and the second sheet.

In the production method according to an exemplary embodiment of the present invention, the protrusions of the patterning roll may be a siloxane-based elastomer.

In the production method according to an exemplary embodiment of the present invention, a pressure may be applied by a first press roll provided to face the patterning roll with the first sheet interposed therebetween and a second press roll provided to face the patterning roll with the second sheet interposed therebetween, respectively, when bringing the first sheet into contact with the patterning roll and when bringing the second sheet into contact with the patterning roll.

In the production method according to an exemplary embodiment of the present invention, a surface of the second sheet at least in contact with the patterning roll may be a corona-treated, plasma-treated, or ozone-treated surface.

In the production method according to an exemplary embodiment of the present invention, irradiation of light including infrared light, application of hot air or dry air, or drying by heating may be further performed immediately after the nanowire formation step or immediately after the fiber formation step.

In the production method according to an exemplary embodiment of the present invention, in the fiber formation step, a coaxial double nozzle including an inner nozzle and an outer nozzle surrounding the inner nozzle may be used at the time of electrospinning to spin the second dispersion through the inner nozzle and to spin a polymer solution through the outer nozzle, thereby forming a composite fiber in which the metallic fiber is wrapped by a polymer sheath.

In the production method according to an exemplary embodiment of the present invention, after the electrospinning, a step of removing the polymer sheath from the composite fiber may be further included.

In the production method according to an exemplary embodiment of the present invention, the metallic fiber may be converted into a conductive fiber by the sintering of the sintering step, and fusion may be performed between the nanowire and the fiber of the fiber-nanowire network and between the nanowires.

In the production method according to an exemplary embodiment of the present invention, a nanowire fill factor which is a ratio of an area covered by the metal nanowire may be 3 to 11%, a fiber fill factor which is a ratio of an area covered by the metallic fiber may be 3 to 10%, and a network fill factor which is a ratio of a total area covered by the fiber-nanowire network may be 9 to 13%, with respect to an area of the first sheet in the nanowire formation step.

In the production method according to an exemplary embodiment of the present invention, the photonic sintering may be performed by pulsed white light irradiation having an intensity of 800 to 1600 J/cm$^2$.

In the production method according to an exemplary embodiment of the present invention, a ratio of a diameter of the metal nanowire to a diameter of the metallic fiber may be 10 to 1000.

In the production method according to an exemplary embodiment of the present invention, the metal nanowire and the metal nanoparticles of the metallic fiber may include silver (Ag), gold (Au), aluminum (Al), copper (Cu), chromium (Cr), nickel (Ni), iron (Fe), or an alloy thereof, respectively.

The present invention includes a patterned flexible electrode produced by the production method described above.

In another general aspect, a patterned flexible electrode includes: a transparent sheet; and a patterned electrode including a conductive network in which a metal nanowire and a metallic conductive fiber are mixed, positioned on the transparent sheet, wherein, based on an electrode region in the transparent sheet, on which the patterned electrode is positioned, a nanowire fill factor which is a ratio of an area covered by the metal nanowire is 3 to 11%, a fiber fill factor which is a ratio of an area covered by the conductive fiber is 3 to 10%, and a conductive network fill factor which is a ratio of an area covered by the conductive network is 9 to 13%, in the electrode region.

The patterned flexible electrode according to an exemplary embodiment of the present invention may have a light transmittance of 90% or more based on the electrode region, and a sheet resistance of 80 Ω/sq. or less based on a linear pattern having a line width of 1 mm.

The patterned flexible electrode according to an exemplary embodiment of the present invention may have a sheet resistant increase rate of 8% or less, when a bending test is performed 100,000 times with a bending radius of 3 mm based on a linear pattern having a line width of 1 mm.

Other features and aspects will be apparent from the following detailed description, the drawings, and the claims.

DESCRIPTION OF THE INVENTION

Hereinafter, the patterned flexible electrode of the present invention and a method of producing the same will be described in detail with reference to the accompanying drawings. The drawings to be provided below are provided by way of example so that the idea of the present invention can be sufficiently transferred to a person skilled in the art to which the present invention pertains. Therefore, the present invention is not limited to the drawings provided below but may be embodied in many different forms, and the drawings suggested below may be exaggerated in order to clear the spirit of the present invention. Technical terms and scientific terms used herein have the general meaning understood by those skilled in the art to which the present invention pertains unless otherwise defined, and a description for the known function and configuration which may unnecessarily obscure the gist of the present invention will be omitted in the following description and the accompanying drawings.

In addition, the singular form used in the specification and claims appended thereto may be intended to also include a plural form, unless otherwise indicated in the context.

In the present specification and the appended claims, the terms such as "first" and "second" are not used in a limited meaning but used for the purpose of distinguishing one constitutional element from other constitutional elements.

In the present specification and the appended claims, the terms such as "comprise" or "have" means that there is a characteristic or a constitutional element described in the specification, and as long as it is not particularly limited, a possibility of adding one or more other characteristics or constitutional elements is not excluded in advance.

In the present specification and the appended claims, when a portion such as a film (layer), a region, and a constitutional element are present on another portion, not only a case in which the portion is in contact with and directly on another portion but also a case in which other films (layers), other regions, and other constitutional elements are interposed between the portions is included.

The method of producing a patterned flexible electrode according to the present invention includes: a nanowire formation step of applying a first dispersion containing a metal nanowire to a first sheet which is unwound from a wound state to form a nanowire network; a fiber formation step of electrospinning a second dispersion containing metal nanoparticles on the nanowire network to form a fiber-nanowire network in which a metallic fiber of the metal nanoparticles being agglomerated is incorporated into the nanowire network; and a sintering step of photonically sintering the fiber-nanowire network to form a conductive network, and a patterning step of using a patterning roll to pattern the fiber-nanowire network before the sintering step or to pattern the conductive network after the sintering step, is performed.

As described above, in the method of producing a patterned flexible electrode according to the present invention, the metal nanowire network is first formed on the first sheet, the second dispersion is electrospun on the metal nanowire network to incorporate a network of the metallic fiber into the metal nanowire network to form the fiber-nanowire network, and the produced fiber-nanowire network is photonically sintered to convert the fiber-nanowire network into the conductive network. By the method, a flexible electrode having both a very high transparency and significantly excellent electrical properties may be produced, and also, a flexible electrode which hardly causes deterioration of electrical properties even repeated deformation in a fine electrode pitch while having excellent flexibility may be produced. Here, a network may refer to a structure which is randomly in contact with the nanowire or the fiber and in which a continuous path between two arbitrary points is provided.

In addition, as described above, in the method of producing a patterned flexible electrode according to the present invention, since the patterning roll is used to pattern the network layer (fiber-nanowire network layer or conductive network layer) formed on the first sheet in a designed pattern before or after a photonic sintering, a fiber-nanowire network layer or a conductive network layer may be patterned by a physical method by the patterning roll without lithography which is a precise multi-step process or an etching process producing toxic waste.

By physical patterning using the patterning roll and sintering by light (photonic sintering), a production process of the patterned flexible electrode including a nanowire formation process, a fiber formation process, an electrode patterning process, and a sintering process may be implemented by a continuous in-line process. Hereinafter, the fiber-nanowire network or the conductive network in a layered form positioned on the first sheet is referred to as a "network layer" or a "network", and the fiber-nanowire network or the conductive network patterned by the patterning roll is referred to as a "patterned network".

In a specific example, the first dispersion may contain a metal nanowire and a first dispersion medium. The metal nanowire may be silver (Ag), gold (Au), aluminum (Al), copper (Cu), chromium (Cr), nickel (Ni), iron (Fe), or an alloy thereof, but is not limited thereto. Even when fine patterning having a fine pitch (width) of an order of several micrometers is performed, the metal nanowire may have an average diameter of about 5 to 100 nm and an aspect ratio of 100 to 10,000, so that a stable network may be formed by the nanowire, but the present invention is not necessarily limited thereto.

Any solvent may be used as the first dispersion medium, as long as the metal nanowire is easily dispersed therein and the solvent may be removed by volatilization at a low temperature. As a specific example, the first dispersion medium may include 2-butoxyethyl acetate, propylene glycol monomethyl ether acetate, diethylene glycol monoethyl ether acetate, ethylene glycol butyl ether, cyclohexanone, cyclohexanol, 2-ethoxyethyl acetate, ethylene glycol diacetate, terpineol, isobutyl alcohol, water, or a mixed solution thereof, but the present invention is not limited to these kinds of the first dispersion medium, of course.

The first dispersion may contain 0.01 to 70 parts by weight of the metal nanowire, based on 100 parts by weight of the first dispersion medium, but the present invention is not limited to the content of the metal nanowire in the first dispersion, of course.

If necessary, the first dispersion may further include additives commonly used in the nanowire dispersion in a nanowire-based transparent electrode field, such as a dispersant, an anticorrosive agent, and a binder, which improve dispersibility of the nanowire, in addition to the metal nanowire and the first dispersion medium, of course.

Application of the first dispersion may be performed using any method which has been used for producing a film or a pattern by applying and drying a liquid or disperse phase, in a semiconductor or display manufacturing field. As an example, application of the first dispersion may use various methods such as coating, spraying, and printing, and as a specific example, spin coating; screen printing; inkjet printing; bar-coating; gravure-coating; blade coating; roll-coating; slot die; electrospinning; spray spinning; and the like may be included, but the present invention is not limited thereto.

In the nanowire formation step, after performing application of the first dispersion, if necessary, drying may be further performed. Drying may be performed by natural drying, irradiation of light including an infrared light, hot air drying, a method of using a dried air flow, heating using a heat source, and the like. However, electrospinning in the fiber formation step may be performed without a separate drying step.

The fiber formation step is a step of incorporating the metallic fiber into the nanowire network using electrospinning to form a fiber-nanowire network. Here, unless otherwise limited, the metallic fiber refers to an agglomerate in a fiber form, and has too high of a resistance to be substantially used as an electrode. As described later, metal nanoparticles agglomerated by a photonic sintering in the sintering step are fused together, whereby the metallic fiber may be converted into a conductive fiber having conductivity. Thus, the metallic fiber and the conductive fiber should be clearly distinguished.

The fiber formation step may include a step of using a coaxial double nozzle including an inner nozzle and an outer nozzle surrounding the inner nozzle, and spinning the second dispersion containing the metal nanoparticles through the inner nozzle and spinning the polymer solution through the outer nozzle to form a composite fiber in which the metallic fiber is wrapped in a polymer sheath.

A polymer is spun from the outer nozzle and wraps the metal nanoparticles spun through the inner nozzle, so that the metal nanoparticles may not be spun widely and the shape of the fiber may be formed and maintained.

The metal nanoparticles of the second dispersion may be, independently of the metal nanowire, silver (Ag), gold (Au), aluminum (Al), copper (Cu), chromium (Cr), nickel (Ni), iron (Fe), or an alloy thereof, but are not limited thereto. However, it is preferred that the metal nanoparticle are the same metal as the metal of the metal nanowire so that at the time of the photonic sintering in the sintering step, the metal nanoparticles are fused together and the metallic fiber is converted into the conductive fiber, and simultaneously, uniformly and stably, contact sites between the conductive fiber (or the metallic fiber in the middle of being converted into the conductive fiber) and the metal nanowire and between the metal nanowire and the metal nanowire are easily fused together.

The metal nanoparticles may only have a size to be easily spun through the inner nozzle. As an example, the metal nanoparticles may have a diameter of about 5 nm to 200 nm. However, it is preferred that the metal nanoparticles have a diameter of about 5 to 100 nm, specifically 5 to 60 nm, and more specifically 20 to 60 nm, so that at the time of the photonic sintering in the sintering step, a high sintering driving force may be provided by the metal nanoparticles.

A content of the metal nanoparticles in the second dispersion may be 60 to 85 wt %, but is not limited thereto. A dispersion medium of the second dispersion may be an alkane-based solvent, an aromatic solvent, an ether-based solvent, an alkyl halide, an ester-based solvent, an aldehyde-based solvent, a ketone-based solvent, an amine-based solvent, an alcohol-based solvent, an amide-based solvent, water, a mixed solvent thereof, or the like. As a substantial example, the dispersion medium of the second dispersion may be methanol, acetone, tetrahydrofuran, toluene, diethyl ether, dimethyl formamide, chloroform, α-terpineol, or the like, but is not limited thereto.

The polymer of the polymer solution may be polyvinylpyrrolidone, polyvinylalcohol, polymethylmethacrylate, polydimethylsiloxane, polyurethane, polyetherurethane, cellulose acetate, cellulose acetate butylate, cellulose acetate propionate, polymethylacrylate, polyvinylacetate, polyacrylonitrile, polyfurfuryl alcohol, polystyrene, polyethylene oxide, polypropylene oxide, polycarbonate, polyvinyl chloride, polycaprolactone, polyvinyl fluoride, polyamide, a copolymer thereof, or the like, but any polymer is possible as long as it is an easily electrospinnable material. A solvent of the polymer solution may be a liquid material which may dissolve the polymer and be easily removed by volatilization, such as an alkane-based solvent, an aromatic-based solvent, an ether-based alkyl halide, an ester-based solvent, an aldehyde-based solvent, a ketone-based solvent, an amine-based solvent, an alcohol-based solvent, an amide-based solvent, water, or a mixed solvent thereof. A concentration of the polymer in the polymer solution may be about 20 to 80 wt %.

The diameter of the metallic fiber may be controlled by a diameter of the inner nozzle of the coaxial double nozzle, and a thickness of the polymer sheath may be controlled by a distance between the inner nozzle and the outer nozzle.

The metallic fiber which is converted into the conductive fiber by the sintering step may form a main current move path by a low resistance as compared with the nanowire, and a relatively fine nanowire as compared with the fiber may serve to connect the fiber and the fiber when the main current move path by the fiber is disconnected by micropatterning.

Thus, the metallic fiber may have a diameter (inner nozzle diameter) of an order of about $10^2$ nm to $10^1$ μm, specifically an order of about $10^0$ μm to $10^1$ μm, so that the main current move path may be provided by the low resistance compared with the nanowire. As a substantial example, the metallic fiber may have a diameter of about 500 nm to 10 μm, or 1 μm to 5 μm. In addition, a ratio of the diameter of the metallic fiber to the diameter of the metal nanowire may be 10 to 1000, specifically 50 to 1000, but is not necessarily limited thereto. Here, since the metallic fiber (or composite fiber) is formed by electrospinning, a length of the metallic fiber (or composite fiber) is not substantially limited. As an example, the metallic fiber (or composite fiber) may have a length of several to several to tens of centimeters, and as an extreme example, the metallic fiber (or composite fiber) introduced to the nanowire network may be a single fiber which is randomly bent and interwound.

The thickness of the polymer sheath (a distance between the inner nozzle and the outer nozzle) may be a thickness to stably restrain the metal nanoparticles spun from the inner nozzle in a fiber form. As an example, the thickness of the polymer sheath may be about 0.1 to 1D based on the diameter (D) of the metallic fiber, but is not limited thereto.

In a specific example, at the time of electrospinning for forming the metallic fiber, a discharge rate of the nozzle may be about 0.1 to 1.0 ml/h, and a voltage may be about 5 to 10 kV, but they are not limited thereto.

As described above, a composite fiber having a core-sheath structure in which the metallic fiber is the core and the polymer is the sheath may be introduced to the nanowire network by the electrospinning.

When the patterning step is performed after the electrospinning in the fiber formation step and before the sintering in the sintering step or before the sintering step, a sheath removal step of removing the polymer sheath from the composite fiber may be further performed. The polymer sheath may be removed using wet removal using an organic solvent, dry removal using reactive ion etching (RIE), thermal decomposition removal using a heat treatment at about 150 to 200° C. in the air, a combination thereof, or the like. However, in terms of an in-line continuous process, it is advantageous to remove the polymer sheath by spraying of an organic solvent or dipping in an organic solvent. Thus, the method of producing a patterned flexible electrode according to an advantageous exemplary embodiment of the present invention may include a nanowire formation step of applying a first dispersion containing a metal nanowire to a first sheet which is unwound from a wound state to form a nanowire network; an step of electrospinning using a coaxial double nozzle, in which a second dispersion containing metal nanoparticles is spun through an inner nozzle and a polymer solution is spun through an outer nozzle to introduce a composite fiber in which a metallic fiber of the metal nanoparticles being agglomerated is wrapped by a polymer sheath to the nanowire network; a fiber formation step of removing the polymer sheath of the composite fiber using an organic solvent to form a fiber-nanowire network in which the metallic fiber is incorporated into the nanowire network; a sintering step of photonically sintering the fiber-nanowire network to form a conductive network; and a patterning step of using a patterning roll to pattern the fiber-nanowire network before the sintering step or pattern the conductive network after the sintering step, wherein the removal of the polymer sheath using the organic solvent may be performed by spraying the organic solvent or dipping in the organic solvent.

When the nanowire network is formed in the nanowire formation step or the metallic fiber is formed in the fiber formation step, a nanowire fill factor which is a ratio of an area covered by the metal nanowire in the first sheet (area covered by the nanowire/area of the first sheet) may be 3 to 11%, and a fiber fill factor which is a ratio of an area covered by the metallic fiber (area covered by fiber/area of the first sheet) may be 3 to 10%. In addition, both the nanowire fill factor and the fiber fill factor may be satisfied, and also a network fill factor which is a ratio of the sum of an area covered by the metal nanowire and an area covered by the metallic fiber (area covered by the fiber-nanowire network/area of the first sheet) may be 9 to 13%, specifically 11 to 13%.

That is, at the time of the application in the nanowire formation step, the first dispersion may be applied so that the nanowire fill factor satisfies 3 to 11%, and at the time of the electrospinning in the fiber formation step, the second dispersion is electrospun so that the fiber fill factor satisfies 3 to 10%, but the application in the nanowire formation step and the electrospinning in the fiber formation step may be performed so that the fiber-nanowire network fill factor satisfies 9 to 13%.

The nanowire fill factor and the fiber fill factor, preferably, the nanowire fill factor, the fiber fill factor, and the fiber-nanowire network fill factor, satisfy the range described above, whereby the produced electrode may have high transparency (light transmittance) while having excellent electrical conductivity.

Specifically, the nanowire fill factor may be 3 to 5%, the fiber fill factor may be 8 to 10%, and the network fill factor may be 11 to 13%. Otherwise, the nanowire fill factor may be 8 to 11%, the fiber fill factor may be 3 to 5%, and the network fill factor may be 11 to 13%. When the fill factor is satisfied, an electrode produced by photonically sintering a network layer may have a light transmittance of 90% or more, specifically 91% or more, and more specifically 92% or more, and together with the excellent optical properties, may also have excellent electrical properties of a sheet resistance of 1.9 $\Omega$/sq. or less, specifically 1.8 $\Omega$/sq. or less, and more specifically 1.7 $\Omega$/sq. or less. Here, the light transmittance may be measured in accordance with ASTM D 1003, and be a light transmittance based on a wavelength of 550 nm. In addition, experimentally, the sheet resistance may be measured using a 4-point probe. In addition, the sheet resistance may be an average value obtained by averaging the sheet resistance values measured at 5 or more random regions, specifically 5 to 50 random regions. In addition, experimentally, the nanowire or fiber fill factor may be a value measured for a sample in which the first dispersion is applied to the first sheet in the same manner as in electrode production to form the nanowire network alone or a sample in which the second dispersion is electrospun in the same manner as in electrode production and the polymer sheath is removed to form a fiber network alone. The network fill factor may be a value measured for a sample in which the first dispersion is applied to the first sheet in the same manner as in electrode production to form the nanowire network, the second dispersion is electrospun on the nanowire network, and the polymer sheath is removed to form the fiber-nanowire network. Measurement of each fill factor may be carried out by obtaining a microstructure observation image using a scanning electron microscope or the like, and then calculating an area of the fiber (fiber fill factor), an area of the nanowire (nanowire fill factor), or an area occupied by the fiber and the nanowire (network fill factor) in the entire area of the image. For easy calculation, the observation image may be converted to black/white, the nanowire or the fiber may be designated as black or white, of course, and the number of black or white pixels relative to the total number of image pixels may be used to calculate the covered area, of course. In addition, each fill factor may be an average value obtained by averaging each fill factor value measured at 5 or more random regions, specifically 5 to 50 random regions of each sample.

As described above, the fiber-nanowire network produced by the fiber formation step may be in the state of having a very high sintering driving force by the metal nanoparticles of the metallic fiber.

Before the patterning step or after the patterning step, the sintering step of sintering the fiber-nanowire network may be performed.

By the photonic sintering in the sintering step, the metal nanoparticles which are agglomerated in a fiber form may be melted and bound and the metallic fiber may be converted into the conductive fiber, and also, fusion (binding) may be performed at a contact point between the fiber and the nanowire and the contact point of the nanowires.

The photonic sintering may be performed by pulsed white light irradiation having an intensity of 800 to 1600 J/cm$^2$, specifically 1300 to 1600 J/cm$^2$. The white light may be a light in a region of 300 to 1000 nm and a pulse width may be 500 to 2000 μsec, specifically 1000 to 2000 μsec. The number of pulses irradiated in the photonic sintering may be 1 to 5, specifically 1 to 3, but is not limited thereto.

When the sintering is performed by a heat treatment, a laminate including the first sheet positioned in a lower portion of the fiber-nanowire network should be heated as a whole, and thus, there is a risk of thermal damage occurring in the first sheet and there is a limitation of using the first sheet having appropriate thermal resistance. In addition, when the sintering is performed by a heat treatment, the heat treatment should be performed at a temperature as low as possible, and thus, a long-term heat treatment of several hours is required for achieving sintering to obtain high electrical conductivity, thereby making it difficult to be used in a commercial process. Furthermore, according to the present invention, since the nanowire network is first formed and then the metallic fiber is incorporated into the nanowire network, the nanowire network should be also heat-treated with the metallic fiber at the time of a heat treatment, and the nanowire is unnecessarily heated at a high temperature for a long time for sintering the fiber so that the nanowire is broken, and thus, there is also a risk of thermal damage of the nanowire network.

However, in the case of the photonic sintering, since the sintering may be completed in a millisecond or second unit, the first sheet may be free from thermal damage, and it is an extremely simple and inexpensive energy saving process, the photonic sintering has excellent commerciality as compared with the heat treatment. In addition, furthermore, according to the present invention, when the nanowire network is first formed, the metallic fiber is incorporated into the nanowire network, and the photonic sintering is performed, since the nanowire is constrained by the metallic fiber, a decrease of contact points by distortion of the nanowire occurring in the photonic sintering may be effectively suppressed.

Unlike the present invention, when the second dispersion is electrospun on a substrate, the polymer sheath is removed, and sintering is performed to form the conductive fiber network first, and then the metal nanowire is applied to introduce the metal nanowire to the conductive fiber network, the metal nanoparticles are in the state of being already sintered to lose most of sintering driving force, and thus, there is a limitation that it is substantially difficult to fuse the metal nanowire and the conductive fiber. Substantially, in order to fuse the metal nanowire on the already sintered conductive fiber, higher heat or light energy than the energy required in the contact point between the nanowires is required, and thus, there is a risk that the nanowire is broken by partial melting of the metal nanowire so that the nanowire network is damaged.

In addition, unlike the present invention, when the second dispersion is electrospun on the substrate, the polymer sheath is removed to form the metallic fiber network, the metal nanowire is applied to introduce the metal nanowire to the metallic fiber network, and then sintering is performed to convert the metallic fiber network into the conductive fiber network, there is a risk that electrical/mechanical properties of the electrode at the time of the photonic sintering are greatly deteriorated, thereby substantially not using the photonic sintering which is advantageous to a commercial process. Substantially, when the metal nanowire is introduced to the metallic fiber network and then a photonic sintering is performed, there is a risk that a metallic fiber part in a lower portion of a region where the contact points between the metal nanowires gather close together is incompletely converted into the conductive fiber. When the electrode is deformed, stress may be concentrated in this completely converted region and the fiber may be broken to greatly deteriorate electrical properties.

However, according to the present invention, when the metal nanowire network is first formed on the first sheet, the metallic fiber is introduced to the nanowire network, and then the nanowire network to which the metallic fiber is introduced (fiber-nanowire network) is sintered all together, the metallic fiber is entirely homogeneously sintered by the photonic sintering and converted into the conductive fiber, and simultaneously, stable and uniform fusion may be performed between the fiber and the nanowire and between the nanowires.

Thus, the electrode produced by photonically sintering the network layer may have extremely excellent physical/electrical properties to maintain a sheet resistance increase rate of 5% or less, even in a bending test of 100,000 times with a bending radius of 3 mm.

Figure 1:
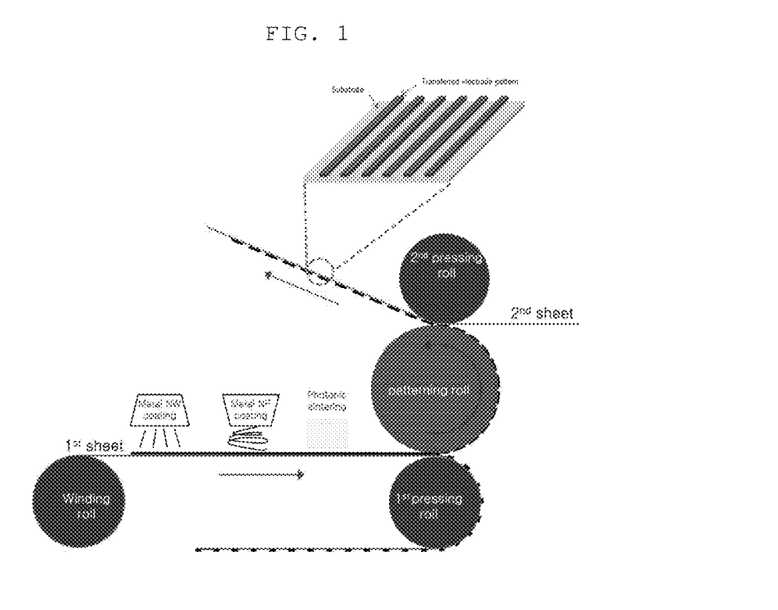
FIG. 1 is an example illustrating a process chart in which a patterning step using a patterning roll is performed after a sintering step, according to an exemplary embodiment of the present invention.
Figure 2:
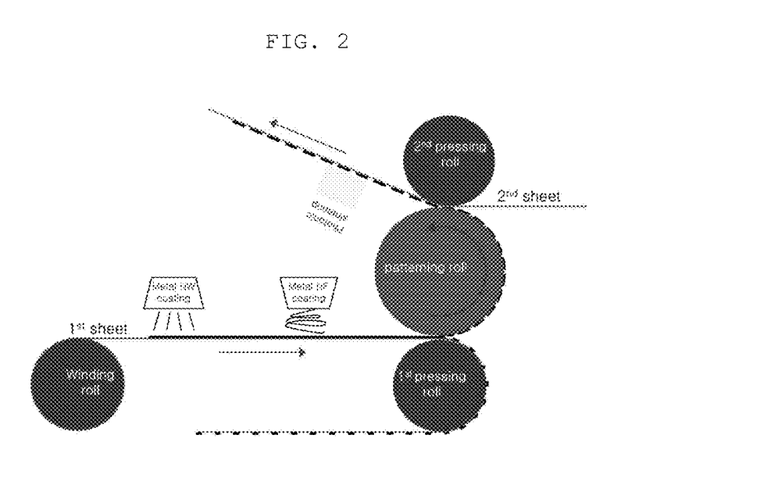
FIG. 2 is an example illustrating a process chart in which a patterning step using a patterning roll is performed before a sintering step, according to another exemplary embodiment of the present invention.

As described above, a patterning step of using a patterning roll to physically pattern the network layer may be performed before the sintering step or after the sintering step. FIG. 1 is an example illustrating a process chart of performing the patterning step using the patterning roll after the sintering step, according to an exemplary embodiment, and FIG. 2 is an example illustrating a process chart illustrating the patterning step using the patterning roll before the sintering step.

However, since both the nanowire and the fiber which are instantaneously heated by light irradiation in the photonic sintering are metals having excellent thermal conductivity, the transparent sheet region in contact with the conductive network is heated to a glass transition temperature (Tg) or higher and the conductive network may be bound to the transparent sheet. Thus, in terms of excellent binding to the transparent sheet, as in FIG. 2, it is preferred that the patterning step is performed after the fiber formation step, and the patterned network is irradiated with light and photonically sintered. However, when release layer or the like having high Tg is formed on the first sheet and is photonically sintered, binding between the network and the sheet may be prevented, and thus, patterning by the patterning roll after the photonic sintering may be also performed, of course, and the case in which patterning is performed after the photonic sintering is not excluded from the present invention.

As illustrated in FIG. 1, a physical patterning step by the patterning roll may be performed, after performing the nanowire formation step (metal NW coating), the fiber formation step (metal NF coating), and the sintering step (photonic sintering). Otherwise, as illustrated in FIG. 2, a physical patterning and step by the patterning roll and the sintering step (photonic sintering) may be performed, after performing the nanowire formation step (metal NW coating) and the fiber formation step (metal NF coating).

In the patterning step, the patterning roll having protrusions formed thereon is in contact with each of the first sheet and the second sheet which is a transparent sheet being unwound from a wound state while rotating, and the network layer may be patterned in a protrusion shape of the patterning roll by contact of the first sheet with the patterning roll and transferred to the patterning roll, and the patterned network positioned on the patterning roll may be transferred to the second sheet by contact of the patterning roll with the second sheet.

The patterning roll may include protrusions having a shape and a dimension corresponding to the designed electrode pattern. Thus, the shape and the dimension of the protrusion may be properly changed considering the use of the flexible electrode, of course. As a substantial example, considering the use of a touch panel and a fingerprint recognition sensor, the patterning roll may have linear protrusions formed thereon, which are arranged to be spaced apart in a rotation direction of the roll and in a width direction of the roll. An example of FIG. 1 is an example in which the linear protrusions arranged to be spaced apart from each other are formed in the width direction of the roll, and corresponds to an example in which the width of the roll has a length corresponding to the width of the first sheet and the second sheet. Here, the width of the linear protrusions may be an order of $10^1$ μm to $10^4$ μm, but the present invention is not limited to the shape of the specific protrusion, a protrusion size, or the like, of course.

The network layer on the first sheet is brought into contact with the protrusion of the patterning roll and a network layer part in contact with the protrusions is released from the network layer part which is not in contact with the protrusions and attached to the protrusions to perform physical patterning, and the protrusions are brought into contact with the second sheet and a network layer part attached to the protrusions is transferred to the second sheet, thereby forming the patterned network on the second sheet.

As in an example illustrated in FIG. 1 and FIG. 2, in the patterning using the patterning roll, a pressure (first pressure) may be applied by a first pressing roll provided to face the patterning roll with the first sheet interposed therebetween when the first sheet and the patterning roll are brought into contact with each other, and a pressure (second pressure) may be applied by a second pressing roll provided to face the patterning roll with the second sheet interposed therebetween when the second sheet and the patterning roll are brought into contact with each other. The pressure may facilitate physical patterning of the network layer by the protrusions, and transfer of the patterned network. The first pressure by the first pressing roll may be any pressure as long as it may be appropriately adjusted so that the protrusions press the network layer and the network layer may be easily cut in an edge region of the protrusions. As a specific example, the first pressure may be about 50 kPa to 1000 kPa, specifically 100 kPa to 1000 kPa, but is not necessarily limited thereto. In addition, the second pressure by the second pressing roll may be any pressure as long as it may be appropriately adjusted to stably transfer the patterned network positioned on the protrusions of the patterning roll to the second sheet, and as a specific example, may be about 50 kPa to 1000 kPa, specifically 50 kPa to 700 kPa, but is not limited thereto.

At least the protrusions of the patterning roll may be a siloxane-based elastomer. Since the siloxane-based elastomer has high elasticity and is not easily damaged even by application of a physical force, it is appropriate as a roll material for transfer, and furthermore, a network layer which is a metal component is attached well to the protrusions, so that transfer from the first sheet to the patterning roll may be easily performed.

The siloxane-based elastomer may be an aliphatic polysiloxane, an aromatic polysiloxane, or a polysiloxane polymer including a siloxane repeating unit including both an aliphatic group and an aromatic group in one repeating unit or independently including each of the groups. As a non-limiting specific example, the aliphatic polysiloxane may be selected from polydimethylsiloxane, polydiethylsiloxane, polymethylethylsiloxane, polydimethylsiloxane-co-diethylsiloxane, polydimethylsiloxane-co-ethylmethylsiloxane, and the like, and the aromatic polysiloxane may be selected from polydiphenylsiloxane, polymethylphenylsiloxane, polyethylphenylsiloxane, poly(dimethylsiloxane-co-diphenylsiloxane), and the like. The polysiloxane including a siloxane repeating unit including both an aliphatic group and an aromatic group in one repeating unit or independently including each of the groups includes all of the repeating units of the aliphatic siloxane and the repeating units of the aromatic siloxane exemplified above, or refers to a form in which each of an aliphatic substituent exemplified above and an aromatic substituent exemplified above is bonded to a silicon element positioned in one repeating unit, but is not limited thereto. As a substantial example, the siloxane-based elastomer may be a siloxane-based elastomer which is commonly used in the field of transferring micropatterns with soft-lithography using stamp or the like, and the polysiloxane according to an example of a commercial product may include Sylgard® 184 from Dow Corning, and the like, but is not limited thereto.

In a specific example, the second sheet may be hydrophilicly surface-treated, have a surface coating layer having low Tg, or have a coating layer which has low Tg and is hydrophilicly surface-treated. Specifically, the second sheet may be a transparent sheet in which a surface in contact with the patterning roll is hydrophilicly surface-treated. Otherwise, the second sheet may include a transparent base sheet; and a coating layer formed on a surface in contact with a patterning roll on the transparent base sheet. Otherwise, the second sheet may include a transparent base sheet; and a coating layer which is positioned on a surface in contact with a patterning roll on the transparent base sheet and hydrophilicly surface-treated.

By the second sheet having a hydrophilic functional group formed thereon by the hydrophilic surface treatment, the patterned network positioned on the patterning roll may be easily transferred to the second sheet when the patterning roll and the second sheet are brought into contact with each other.

The hydrophilic surface treatment may be any method as long as it is commonly used for surface modification of a polymer to have hydrophilicity, such as a corona treatment, a plasma treatment, and/or an ozone treatment. However, the hydrophilic surface treatment is not limited to the surface modification, and may be performed by forming a primer layer having a hydrophilic functional group. The primer layer may be any primer material which is conventionally commonly used for forming a hydrophilic surface on a transparent electrode based on a metal nanowire, and as an example, may include monomers, oligomers, polymers, or combinations thereof of urethane acrylate, acryl acrylate, epoxy acrylate, urethane, and the like, but is not limited thereto.

The coating layer may be a transparent polymer layer having low Ts, specifically a low glass transition temperature (Tg) of 80 to 140° C., specifically, 100 to 140° C., and more specifically, 100 to 130° C. When a photonic sintering is performed after performing patterning as in FIG. 2, the conductive network may be sintered by the coating layer of the transparent polymer layer having low Tg and also bound to the second sheet. As a substantial example of the material, the transparent polymer of the transparent polymer layer may be one or a mixture of two or more of polyester, polyethylene terephthalate (PET), acrylate (AC), polybutylene terephthalate, polymethyl methacrylate (PMMA), acrylic resins, polycarbonate (PC), polystyrene, triacetate (TAC), polyvinyl alcohol, polyvinyl chloride, polyvinylidene chloride, polyethylene, ethylenevinylacetate copolymers, polyvinyl butyral, metal ion-crosslinked ethylene-methacrylic acid copolymers, polyurethane, cellophane, and polyolefin, but is not limited thereto. As a more specific example, the transparent polymer of the transparent polymer layer may be one or two or more materials selected from nonionic urethane and acryl. Here, the transparent polymer may have a weight average molecular weight of 1000 to 500,000,000, but is not limited thereto. In an example of the specific materials of the transparent polymer, the material may have physical properties satisfying the suggested glass transition temperature, using various known methods such as the kind of material, a polymerization degree, a molecular weight distribution, a mixing ratio of different materials from each other, functional group introduction, and additives, of course. The thickness of the transparent polymer layer may be appropriately adjusted considering the use of the patterned flexible electrode. As an example, the transparent polymer layer (coating layer) may have a thickness of about 50 nm to 10 μm, but is not limited thereto.

The first sheet and the second sheet (or transparent base sheet) may be appropriately selected considering the use and the specific process conditions, and as an example, the first sheet and the second sheet (or transparent base sheet) may be polyester-based films such as polyester naphthalate or polycarbonate; polyolefin-based film such as linear, branched, and cyclic polyolefin; polyvinyl-based films such as polyvinyl chloride, polyvinylidene chloride, polyvinyl acetal, polystyrene, and polyacryl; cellulose ester base films such as cellulose triacetate or cellulose acetate; polysulfone films such as polyethersulfone; polyimide films; or silicone films; and the like, but the present invention is not limited to the specific material of the sheet, of course. However, the transparent sheet (or transparent polymer layer) may have a light transmittance to a light having a wavelength of 550 nm of 90% or more, specifically 93% or more, more specifically 95% or more, and more specifically 97% or more.

The present invention includes a patterned flexible electrode produced by the production method described above.

The present invention provides a patterned flexible electrode in which the conductive network of the metal nanowire and the metallic conductive fiber being mixed is patterned. Here, the metal nanowire corresponds to the metal nanowire described above in the production method, the metallic conductive fiber corresponds to the conductive fiber obtained by sintering the metallic fiber in the sintering step of the production method, the conductive network corresponds to the network obtained by photonically sintering the fiber-nanowire network in the production method, and the pattern of the patterned conductive network corresponds to the pattern of the protrusions described above in the production method. Thus, the transparent electrode includes all contents of the production method described above.

The patterned flexible electrode according to the present invention includes: a transparent sheet; and a patterned electrode including a conductive network in which a metal nanowire and a metallic conductive fiber are mixed, positioned on the transparent sheet, wherein, based on an electrode region in the transparent sheet, on which the patterned electrode is positioned, a nanowire fill factor which is a ratio of an area covered by the metal nanowire is 3 to 11%, a fiber fill factor which is a ratio of an area covered by the conductive fiber is 3 to 10%, and a network fill factor which is a ratio of an area covered by the conductive network is 9 to 13%, in the electrode region.

In the patterned flexible electrode according to an exemplary embodiment, the nanowire fill factor may be 3 to 5%, the conductive fiber fill factor may be 8 to 10%, and the conductive network fill factor may be 11 to 13%. In the patterned flexible electrode according to an exemplary embodiment, the nanowire fill factor may be 8 to 11%, the conductive fiber fill factor may be 3 to 5%, and the network fill factor may be 11 to 13%. When the fill factor is satisfied, the transparent electrode may have a light transmittance of 90% or more, specifically 91% or more, and more specifically 92% or more, and together with the excellent optical properties, may also have excellent electrical properties of a sheet resistance of 1.9 Ω/sq. or less, specifically 1.8 Ω/sq. or less, and more specifically 1.7 Ω/sq. or less, when the unpatterned network layer is photonically sintered, together with the excellent optical properties.

In addition, the patterned flexible electrode according to an exemplary embodiment may have a sheet resistant increase rate of 5% or less, when a bending test is performed 100,000 times with a bending radius of 3 mm when the unpatterned network layer is photonically sintered.

In addition, the patterned flexible electrode according to an exemplary embodiment may have a light transmittance of 90% or more based on the electrode region, and a sheet resistance of 80 Ω/sq. or less based on a linear pattern having a line width of 1 mm or less.

In addition, the patterned flexible electrode according to an exemplary embodiment may have a sheet resistant increase rate of 8% or less, specifically 7.5% or less, when a bending test is performed 100,000 times with a bending radius of 3 mm based on a linear pattern having a line width of 1 mm.

The bending test may be performed with bending with a radius of 3 mm using a common two point bending tester, and the sample used in the bending test may have a length×a width of about 5 to 30 cm×5 to 30 cm.

The present invention includes a transparent electrode produced by the production method described above and a display device including the transparent electrode described above.

As a specific example, the present invention includes a transparent electrode produced by the production method described above and a liquid crystal display including the transparent electrode described above.

As a specific example, the present invention includes a transparent electrode produced by the production method described above and a touch panel including the transparent electrode described above.

As a specific example, the present invention includes a transparent electrode produced by the production method described above and an electroluminescent device including the transparent electrode described above.

As a specific example, the present invention includes a transparent electrode produced by the production method described above and a photovoltaic cell including the transparent electrode described above.

As a specific example, the present invention includes a transparent electrode produced by the production method described above and an anti-static layer including the transparent electrode described above.

As a specific example, the present invention includes a transparent electrode produced by the production method described above and a fingerprint recognition sensor including the transparent electrode described above.

Figure 3:
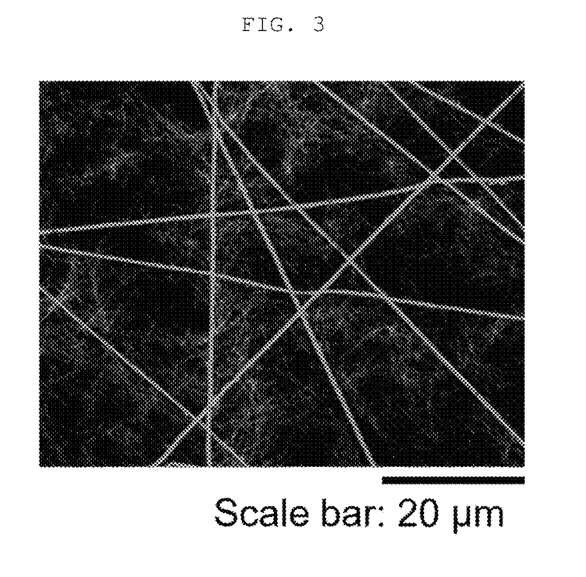
FIG. 3 is a scanning electron microscope image in which a conductive network produced according to an exemplary embodiment of the present invention is observed.
Figure 4:
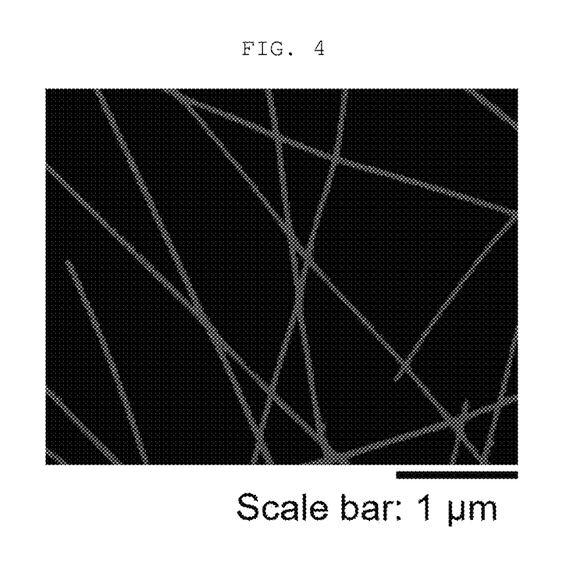
FIG. 4 is a scanning electron microscope image in which a network part between nanowires in a conductive network produced according to an exemplary embodiment of the present invention is observed.

FIG. 3 is a scanning microscope image in which the conductive network produced according to an exemplary embodiment of the present invention is observed, and FIG. 4 is a scanning microscope image in which a network part between nanowires is observed. Specifically, the conductive network of FIG. 3 (and FIG. 4) was a transparent electrode sample (Sample 5 of Table 1) produced by using an Ag nanowire (diameter of 80 nm, aspect ratio of 1000) dispersion to apply the nanowire dispersion to a substrate (polyethylene terephthalate film) so that a nanowire fill factor is 9.5% to form a nanowire network, electrospinning 78 wt % of a silver nanoparticle (diameter of 20 nm) dispersion and a polyethylene oxide polymer solution on the nanowire network with a coaxial double nozzle to incorporate a fiber (metallic fiber diameter=1 μm) thereto so that a metallic fiber fill factor is 4.4%, performing washing with an organic solvent to remove a polyethylene oxide polymer sheath to produce a fiber-nanowire network, and then irradiating a white light (300-1000 nm) purse with a pulse width of 1500 μsec and an intensity of 1201.5 J/cm$^2$ three times. Here, the conductive network fill factor was 12.4%. The thus-produced electrode had a light transmittance of 91% and a sheet resistance of 1.7 Ω/sq.

As seen from FIGS. 3 and 4, it was confirmed that a conductive fiber which was uniformly sintered without inner voids and surface cracks by a photonic sintering was produced, and it was found that a conductive network in which contact points between nanowires are fused was produced together with sintering of the silver nanoparticles of the metallic fiber.

A transparent electrode (Sample 3 of Table 1) was produced in the same manner as the samples of FIGS. 3 and 4, except that incorporation was performed so that the nanowire fill factor when applying the first dispersion-the metallic fiber fill factor when electrospinning the second dispersion was 4.2%-8.9%. Here, the conductive network fill factor was 11.6%. The thus-produced transparent electrode had a light transmittance of 92% and a sheet resistance of 1.9 Ω/sq.

Similarly, the conductive network fill factor (Net. FF), the transmittance, and the sheet resistance of the transparent electrode which was produced with a difference of the nanowire fill factor (Wir. FF) when applying the first dispersion-the metallic fiber fill factor (Fib. FF) when electrospinning the second dispersion are summarized in Table 1.

TABLE 1

| | Sample 1 | Sample 2 | Sample 3 | Sample 4 | Sample 5 | Sample 6 | Sample 7 | Sample 8 | Sample 9 |
|---|---|---|---|---|---|---|---|---|---|
| Wir. FF (%) | 4.2 | 4.2 | 4.2 | 9.5 | 9.5 | 9.5 | 14.1 | 14.1 | 14.1 |
| Fib. FF (%) | 2.1 | 4.4 | 8.9 | 2.1 | 4.4 | 8.9 | 2.1 | 4.4 | 8.9 |
| Net. FF (%) | 4.8 | 8.9 | 11.6 | 10.1 | 12.4 | 16.9 | 14.7 | 17 | 21.5 |
| Transmittance (%) | 95 | 94 | 92 | 93 | 91 | 87 | 89 | 86 | 82 |
| Sheet resistance (Ω/sq.) | 9.5 | 3.1 | 1.9 | 7.9 | 1.7 | 1.4 | 7.5 | 1.5 | 1.3 |

As seen from Table 1, it was found that when the nanowire fill factor was in a range of 3 to 5% and the conductive fill factor was in a range of 8 to 10% and when the nanowire fill factor was in a range of 8 to 11% and the conductive fiber fill factor was in a range of 3 to 5%, the electrode may have both excellent transparency of a light transmittance of 91% or more and excellent electrical properties of a sheet resistance of 1.9 Ω/sq. or less.

Figure 5:
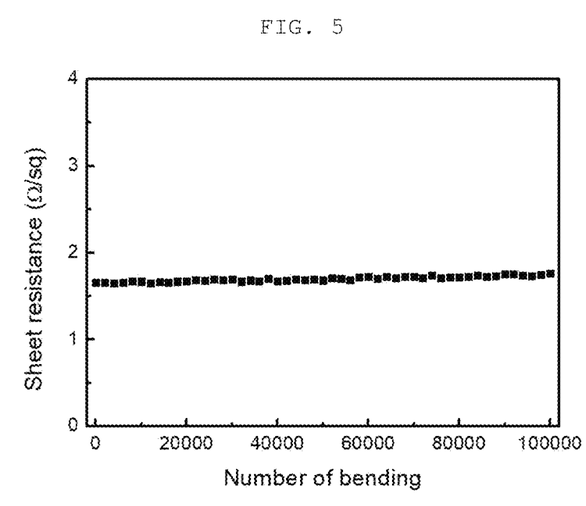
FIG. 5 is a drawing illustrating a sheet resistance depending on the number of bends measured by performing a bending test 100,000 times with a curvature radius of 3 mm for a transparent electrode produced by photonically sintering an unpatterned network layer.

FIG. 5 is a drawing illustrating a sheet resistance depending on the number of bends measured by performing a bending test 100,000 times with a curvature radius of 3 mm for the produced transparent electrode (Sample 5). As seen from FIG. 5, the sheet resistance after the bending test of 100,000 times was 1.76 Ω/sq., and it was found that a resistance increase rate [=(sheet resistance after bending test of 100,000 times−sheet resistance immediately after production)/(sheet resistance immediately after production)× 100] was only 3.5%.

For comparison, a transparent electrode was produced in the same manner and with the same fill factor as Sample 5, except that the second dispersion was first electrospun and washing was performed with an organic solvent to produce a fiber network, and the first dispersion in which the nanowire was dispersed was applied to the fiber network and photonically sintered to produce the transparent electrode (Comparison Sample 1). The thus-produced transparent electrode (Comparison Sample 1) showed a similar light transmittance to Sample 5, but it was confirmed that the sheet resistance was increased to 2.0 Ω/sq. and greatly increased to 4.7 Ω/sq. when the electrode was subjected to a bending test 100,000 times with a curvature radius of 3 mm.

In addition, a transparent electrode was produced in the same manner and with the same fill factor as Sample 5, except that the second dispersion was first electrospun and washing was performed with an organic solvent to produce a fiber network, a heat treatment was performed at 200° C. for 2 hours to convert the metallic fiber network to the conductive fiber network, and then the first dispersion in which the nanowire was dispersed was applied to the conductive fiber network and photonically sintered to produce the transparent electrode (Comparison Sample 2). The thus-produced transparent electrode (Comparison Sample 2) showed a similar light transmittance to Sample 5, but it was confirmed that the sheet resistance was increased to 1.8 Ω/sq. and increased to 2.3 Ω/sq. when the electrode was subjected to a bending test 100,000 times with a curvature radius of 3 mm.

Figure 6:
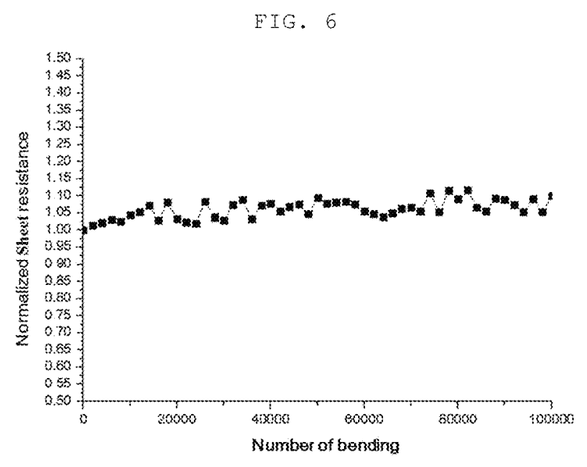
FIG. 6 is a drawing illustrating a sheet resistance depending on the number of bends measured by performing a bending test 100,000 times with a curvature radius of 3 mm for a transparent electrode produced by photonically sintering a network patterned in a linear electrode having a width of 1 mm.

FIG. 6 is a drawing illustrating a sheet resistance increase ratio (sheet resistance after bending test/sheet resistance after bending test, normalized sheet resistance) depending on the number of bends for the patterned flexible electrode produced by using a polydimethylsiloxane patterning roll having protrusions formed thereon so that linear electrodes having a width of 1 mm are arranged to be spaced apart (spacing of 1 mm) parallel to each other, using a polyethylene terephthalate film as the first sheet, using an ozone-treated polyethylene terephthalate film as the second sheet, applying a pressure of 500 kPa when bringing the patterning roll into contact with the first sheet using pressing rolls and applying a pressure of 100 kPa when bringing the patterning roll into contact with the second sheet to transfer an unsintered fiber-nanowire network pattern to the second sheet, and performing a photonic sintering. Here, nanowire formation, fiber formation, and photonic sintering conditions were the same as those for Sample 5. It was confirmed that the sheet resistance was increased to 79 Ω/sq. by micropatterning, but even when a linear patterning having a width of 1 mm was performed, a resistance increase rate was only 7.48% in a bending test of 100,000 times.

The production method according to the present invention may mass-produce a patterned flexible electrode having excellent optical, mechanical, and electrical properties with an in-line continuous process based on a simple and rapid stage without using a lithography process or an etching process.

Hereinabove, although the present invention has been described by specific matters, limited exemplary embodiments, and drawings, they have been provided only for assisting the entire understanding of the present invention, and the present invention is not limited to the exemplary embodiments, and various modifications and changes may be made by those skilled in the art to which the present invention pertains from the description.

Therefore, the spirit of the present invention should not be limited to the above-described exemplary embodiments, and the following claims as well as all modified equally or equivalently to the claims are intended to fall within the scope and spirit of the invention.

What is claimed is:

1. A method of producing a patterned flexible electrode, the method comprising:
   a nanowire formation step of applying a first dispersion containing a metal nanowire to a first sheet which is unwound from a wound state to form a nanowire network;
   a fiber formation step of electrospinning a second dispersion containing metal nanoparticles on the nanowire network to form a fiber-nanowire network in which a metallic fiber of the metal nanoparticles being agglomerated is incorporated into the nanowire network;
   a sintering step of photonically sintering the fiber-nanowire network to form a conductive network; and
   a patterning step of using a patterning roll to pattern the fiber-nanowire network before the sintering step or pattern the conductive network after the sintering step, and
   wherein in the patterning step, the patterning roll on which protrusions are formed is brought into contact with each of the first sheet and a second sheet which is unwound from a wound state while rotating, the fiber-nanowire network or the conductive network is patterned in a shape of the protrusions by the contact of the first sheet with the patterning roll and transferred to the patterning roll, and a patterned network positioned on the patterning roll is transferred to the second sheet by the contact of the patterning roll and the second sheet.

2. The method of producing a patterned flexible electrode of claim 1, wherein the protrusions of the patterning roll are a siloxane-based elastomer.

3. The method of producing a patterned flexible electrode of claim 1, wherein a pressure is applied by a first press roll provided to face the patterning roll with the first sheet interposed therebetween and a second press roll provided to face the patterning roll with the second sheet interposed therebetween, respectively, when bringing the first sheet into contact with the patterning roll and when bringing the second sheet into contact with the patterning roll.

4. The method of producing a patterned flexible electrode of claim 1, wherein a surface of the second sheet which is at least in contact with the patterning roll is corona-treated, plasma-treated, or ozone-treated.

5. The method of producing a patterned flexible electrode of claim 1, wherein irradiation of light including infrared light, application of hot air or dry air, or drying by heating is further performed immediately after the nanowire formation step or immediately after the fiber formation step.

6. The method of producing a patterned flexible electrode of claim 1, wherein in the fiber formation step, a coaxial double nozzle including an inner nozzle and an outer nozzle surrounding the inner nozzle is used at the time of electrospinning to spin the second dispersion through the inner nozzle and to spin a polymer solution through the outer nozzle, thereby forming a composite fiber in which the metallic fiber is wrapped by a polymer sheath.

7. The method of producing a patterned flexible electrode of claim 6, further comprising: removing the polymer sheath from the composite fiber after the electro spinning.

8. The method of producing a patterned flexible electrode of claim 1, wherein the metallic fiber is converted into a conductive fiber by the sintering of the sintering step and fusion is performed between the nanowire and the fiber of the fiber-nanowire network and between the nanowires.

9. The method of producing a patterned flexible electrode of claim 1, wherein in the nanowire formation step, a nanowire fill factor which is a ratio of an area covered by the metal nanowire is 3 to 11%, a fiber fill factor which is a ratio of an area covered by the metallic fiber is 3 to 10%, and a network fill factor which is a ratio of a total area covered by the fiber-nanowire network is 9 to 13%, with respect to an area of the first sheet.

10. The method of producing a patterned flexible electrode of claim 1, wherein the photonic sintering is performed by irradiation of a pulsed white light which is in a region of 300 to 1000 nm having an intensity of 800 to 1600 $J/cm^2$.

11. The method of producing a patterned flexible electrode of claim 1, wherein a ratio of a diameter of the metallic fiber to a diameter of the metal nanowire is 10 to 1000.

12. The method of producing a patterned flexible electrode of claim 1, wherein the metal nanowire and the metal nanoparticles of the metallic fiber include silver (Ag), gold (Au), aluminum (Al), copper (Cu), chromium (Cr), nickel (Ni), iron (Fe), or an alloy thereof, respectively.

* * * * *